(12) United States Patent
Ritter

(10) Patent No.: US 10,849,230 B2
(45) Date of Patent: Nov. 24, 2020

(54) SURFACE MOUNTED SWITCH ASSEMBLY

(71) Applicant: INTERDIGITAL CE PATENT HOLDINGS, Paris (FR)

(72) Inventor: Darin Bradley Ritter, Indianapolis, IN (US)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 0 days.

(21) Appl. No.: 16/278,155

(22) Filed: Feb. 17, 2019

(65) Prior Publication Data

US 2019/0320533 A1 Oct. 17, 2019

Related U.S. Application Data

(60) Provisional application No. 62/632,203, filed on Feb. 19, 2018.

(51) Int. Cl.
*H01H 13/04* (2006.01)
*H05K 1/18* (2006.01)

(52) U.S. Cl.
CPC ............. *H05K 1/18* (2013.01); *H01H 13/04* (2013.01); *H05K 2201/10053* (2013.01); *H05K 2201/10424* (2013.01)

(58) Field of Classification Search
CPC .... H01H 13/14; H01H 3/125; H01H 13/7065; H01H 2221/058; H01H 13/52; H01H 13/705; H01H 13/04; H01H 13/20; H01H 3/12; H01H 13/70; H01H 13/48; H01H 1/5805; H01H 2001/5888; H01H 2207/004; H01H 2225/028; H01H 13/12; H01H 13/18; H01H 15/16; H01H 2001/5816; H01H 2223/012

See application file for complete search history.

(56) References Cited

U.S. PATENT DOCUMENTS

| | | | |
|---|---|---|---|
| 4,535,209 A | 8/1985 | Kurz | |
| 7,638,724 B2 | 12/2009 | Altmann et al. | |
| 2013/0327621 A1* | 12/2013 | Dinh | H01H 1/20 200/292 |
| 2014/0048400 A1* | 2/2014 | Malek | H01H 13/06 200/517 |

FOREIGN PATENT DOCUMENTS

DE 3624160 7/1986
WO WO2007141897 12/2007

* cited by examiner

*Primary Examiner* — Ahmed M Saeed
(74) *Attorney, Agent, or Firm* — Patricia A. Verlangieri

(57) ABSTRACT

A switch assembly for an electronic device is described. The switch assembly includes a switch member, a housing and a support member. The housing is mounted on a printed circuit board and the switch member is attached to the housing. The support member is mounted on the surface of the printed circuit board adjacent to a back surface of the switch member.

23 Claims, 5 Drawing Sheets

SURFACE MOUNTED SWITCH ASSEMBLY

REFERENCE TO RELATED PROVISIONAL APPLICATION

This application claims priority from U.S. Provisional Application No. 62/632,203, entitled "SURFACE MOUNTED SWITCH ASSEMBLY", filed on Feb. 19, 2018, the contents of which are hereby incorporated by reference in its entirety.

FIELD

The disclosure generally relates to electronic devices. At least one embodiment relates to an electronic device having a surface mounted switch.

BACKGROUND

Consumer and market preference for electronic devices such as set top boxes, computers, game consoles, DVD players, CD players, etc., is to have such devices include mechanical switches. Typically, these mechanical switches are pushbutton switches.

Pushbutton switches are two-position devices actuated with a button that is pressed and released. To simplify the manufacturing process, it is desirable to have the pushbutton switch mounted directly onto the surface of a printed circuit board (PCB) using surface mount technology, whereby metal contacts of the switch are soldered to conductive foil pads and traces on the surface of the PCB. However, activating the switch by pressing the pushbutton induces stress into the cured epoxy bond between the surfaces of the copper foil and the glass filled substrate material of the PCB. Such stress may eventually cause the connection mounting the pushbutton switch on the PCB to fail.

The present disclosure is directed toward overcoming one or more of these drawbacks.

SUMMARY

According to a first aspect of the disclosure, a switch assembly for an electronic device is described. The switch assembly comprises a switch member, a housing and a support member. The housing is mounted on a printed circuit board and the switch member is attached to the housing. The support member is mounted on the surface of the printed circuit board adjacent to a back surface of the switch member.

In another embodiment, the surface of the switch member adjacent to the support member contacts the support member when the switch member is activated.

In another embodiment, the switch member comprises a pushbutton switch moveable within the switch member for activation.

In another embodiment, the switch member is activated by application of a pressing force to the pushbutton at a first surface of the switch member and the surface opposite the first surface contacts the support member when the switch member is activated.

In another embodiment, the support member acts to impede movement of the switch member in the direction of movement of the pressing force.

In another embodiment, the support member is formed of plastic.

In another embodiment, the housing has sidewalls that extend beyond a back surface of the switch member.

In another embodiment, the sidewalls of the housing are provided with a plurality of support elements contacting the printed circuit board.

In another embodiment, the support member comprises at least one fastener to mount the support member on the surface of the printed circuit board.

In another embodiment, the at least one fastener limits movement of the support member in at least one of the direction of movement of the pushbutton switch and a generally perpendicular movement to the direction of movement of the pushbutton switch when the switch is activated.

In another embodiment, the support member comprises a rectangular base and a T-shaped portion extending upward from the rectangular base.

In another embodiment, the T-shaped portion of the support member contacts the surface of the switch member to limit the movement of the switch member in the direction of movement of the pushbutton switch to the distance between the surface of the switch member adjacent to the support member and the T-shaped portion of the support member.

In another embodiment, the T-shaped portion of the support member is positioned between the sidewalls of the housing adjacent to the surface of the switch member.

In another embodiment, a plurality of fasteners are used to mount the housing on the surface of the printed circuit board.

According to a second aspect of the disclosure, a switch assembly for an electronic device is described. The electronic device includes a printed circuit board. The switch assembly comprises a switch member, a housing and a support member. The housing is mounted on the printed circuit board and the switch member is attached to the housing. The support member is mounted on the surface of the printed circuit board adjacent to a back surface of the switch member.

In another embodiment, the surface of the switch member adjacent to the support member contacts the support member when the switch member is activated.

In another embodiment, the switch member comprises a pushbutton switch moveable within the switch member for activation.

In another embodiment, the switch member is activated by application of a pressing force to the pushbutton at a first surface of the switch member and the surface opposite the first surface contacts the support member when the switch member is activated.

In another embodiment, the support member acts to impede movement of the switch member in the direction of movement of the pressing force.

In another embodiment, the support member is formed of plastic.

In another embodiment, the housing has sidewalls that extend beyond a back surface of the switch member.

In another embodiment, the sidewalls of the housing are provided with a plurality of support elements contacting the printed circuit board.

In another embodiment, the support member comprises at least one fastener to mount the support member on the surface of the printed circuit board.

In another embodiment, the at least one fastener limits movement of the support member in at least one of the direction of movement of the pushbutton switch and a generally perpendicular movement to the direction of movement of the pushbutton switch when the switch is activated.

In another embodiment, the support member comprises a rectangular base and a T-shaped portion extending upward from the rectangular base.

In another embodiment, the T-shaped portion of the support member contacts the surface of the switch member to limit the movement of the switch member in the direction of movement of the pushbutton switch to the distance between the surface of the switch member adjacent to the support member and the T-shaped portion of the support member.

In another embodiment, the T-shaped portion of the support member is positioned between the sidewalls of the housing adjacent to the surface of the switch member.

In another embodiment, a plurality of fasteners are used to mount the housing on the surface of the printed circuit board.

According to a third aspect of the disclosure, a switch assembly for a set top box is described. The set top box includes a casing, a printed circuit board with a wall of the casing that abuts a portion of a side of the printed circuit board and a switch assembly. The switch assembly comprises a switch member, a housing and a support member. The housing is mounted on the printed circuit board and the switch member is attached to the housing. The support member is mounted on the surface of the printed circuit board adjacent to a back surface of the switch member.

In another embodiment, the surface of the switch member adjacent to the support member contacts the support member when the switch member is activated.

In another embodiment, the switch member comprises a pushbutton switch moveable within the switch member for activation.

In another embodiment, the switch member is activated by application of a pressing force to the pushbutton at a first surface of the switch member and the surface opposite the first surface contacts the support member when the switch member is activated.

In another embodiment, the support member acts to impede movement of the switch member in the direction of movement of the pressing force.

In another embodiment, the support member is formed of plastic.

In another embodiment, the housing has sidewalls that extend beyond a back surface of the switch member.

In another embodiment, the sidewalls of the housing are provided with a plurality of support elements contacting the printed circuit board.

In another embodiment, the support member comprises at least one fastener to mount the support member on the surface of the printed circuit board.

In another embodiment, the at least one fastener limits movement of the support member in at least one of the direction of movement of the pushbutton switch and a generally perpendicular movement to the direction of movement of the pushbutton switch when the switch is activated.

In another embodiment, the support member comprises a rectangular base and a T-shaped portion extending upward from the rectangular base.

In another embodiment, the T-shaped portion of the support member contacts the surface of the switch member to limit the movement of the switch member in the direction of movement of the pushbutton switch to the distance between the surface of the switch member adjacent to the support member and the T-shaped portion of the support member.

In another embodiment, the T-shaped portion of the support member is positioned between the sidewalls of the housing adjacent to the surface of the switch member.

In another embodiment, a plurality of fasteners are used to mount the housing on the surface of the printed circuit board.

BRIEF DESCRIPTION OF THE DRAWINGS

These and other aspects, features and advantages of the present disclosure will be described or become apparent from the following detailed description of the preferred embodiment, which is to be read in connection with the accompanying drawings.

In the drawings, wherein like reference numerals denote similar elements throughout the views.

It should be understood, that the drawings are for purposes of illustrating the concepts of the disclosure and are not necessarily the only possible configuration for illustrating the disclosure.

DETAILED DESCRIPTION

The present description illustrates the principles of the present disclosure. It will thus be appreciated that those skilled in the art will be able to devise various arrangements that although not explicitly described or shown herein, embody the principles of the disclosure and are included within the spirit and scope.

All examples and conditional language recited herein are intended for instructional purposes to aid the reader in understanding the principles of the disclosure and the concepts contributed by the inventor to furthering the art and, are to be construed as being without limitation to such specifically recited examples and so conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed to perform the same function, regardless of structure.

Figure 1:
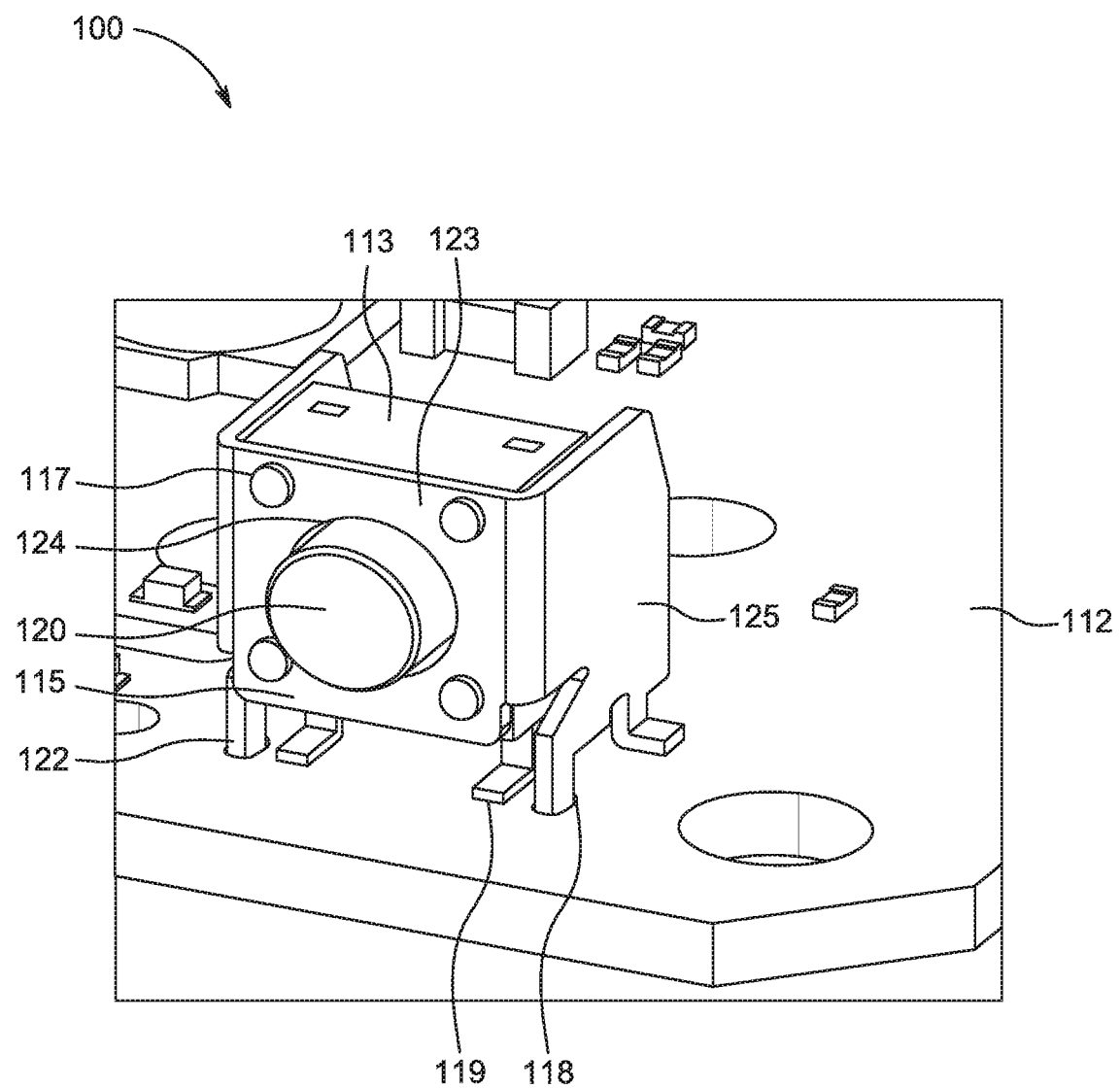
FIG. 1 is a view showing a portion of a printed circuit board (PCB) of an electronic device of the present disclosure having a housing and pushbutton switch mounted thereon.

FIG. 1 is an illustration of a partial view of an electronic device 100 of the present disclosure. The electronic device 100 may include for example a set top box, a computer, a game console, a DVD player, and a CD player. The electronic device 100 includes at least one printed circuit board 112.

A switch assembly is illustrated comprising a switch member 113 and a housing 115 for housing the switch member 113. A housing 115 is mounted on a surface of the printed circuit board 112. The housing 115 includes a front surface 123, and two sidewalls 125. The housing has a unitary structure with the sidewalls 125 extending away from the front surface 123. The housing 115 is preferably formed of for example a plastic material.

The housing includes at least one locating pin 122 and a plurality of tabs 119. The at least one locating pin 122 and the plurality of tabs are used to mount the housing 115 on the surface of the printed circuit board 112. Each of the at least one locating pin 122 is inserted in a feedthrough 118 in the printed circuit board 112. The tabs 119 are surface mounted on the printed circuit board 112 with fasteners, for example, an adhesive (not shown).

The switch member 113 is mounted on the front surface 123 of the housing 115 with a plurality of fasteners 117. The fasteners 117 may be for example, screws, rivets, pins, etc. In this embodiment, the switch member 113 is a pushbutton switch 113 having a button 120, that protrudes through an opening 124 in the front surface 123 of the housing 115 and is moveable by a pressing force within the switch member 113 to activate the switch. The housing 115 and pushbutton switch 113 are mounted on an area of the printed circuit board 112, so as to provide access to activate the button 120 on the pushbutton switch 113 through, for example, a faceplate (not shown) or a casing (not shown).

Figure 2:
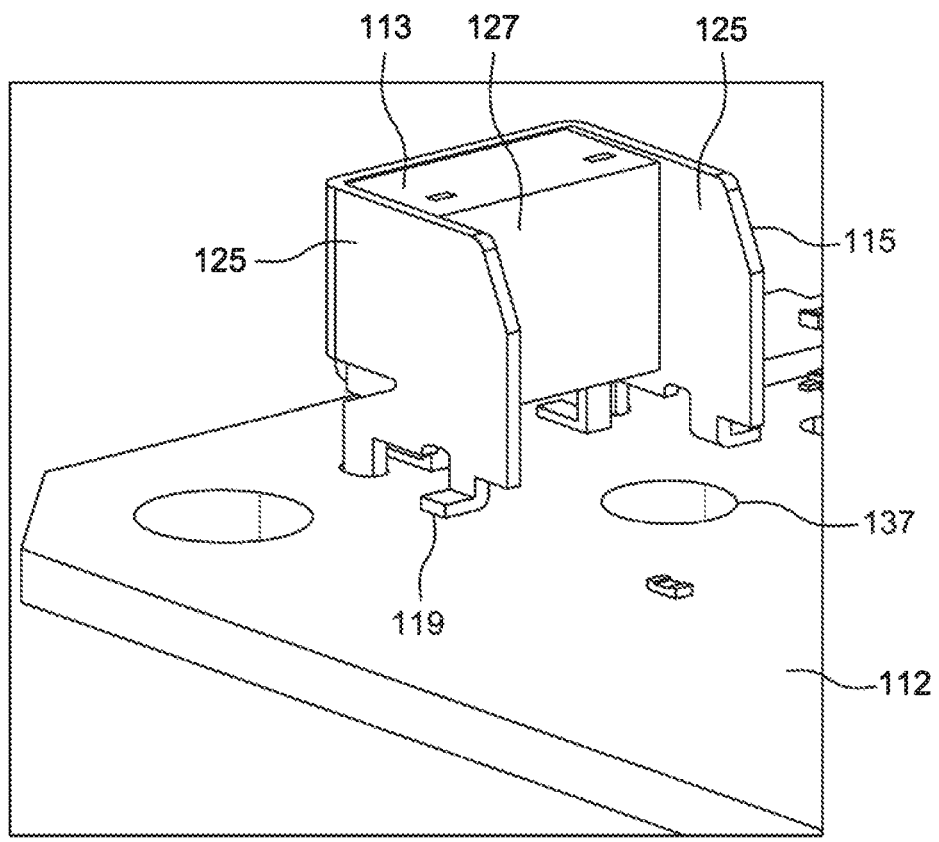
FIG. 2 is a rear view of the housing and pushbutton switch mounted on the printed circuit board of FIG. 1.

Referring to FIG. 2, there is shown a rear view of the housing 115 and pushbutton switch 113 mounted on the surface of the printed circuit board 112 shown in FIG. 1. The housing sidewalls 125 extend beyond the back surface 127 of the pushbutton switch 113 and have tabs 119 attached thereto to provide support for the housing 115 when the button (shown in FIG. 1) is activated.

The extended housing sidewalls 125 also limit movement of the housing 115 in the direction of the pressing force used to actuate the pushbutton, i.e., front to back movement in the illustrated example. The front to back movement of the housing 115 can undesirably cause the adhesive (not shown) mounting the tabs 119 to the circuit board 112 to become stressed and eventually fail after the button 120 on the switch 113 is repeatedly activated.

Figure 3:
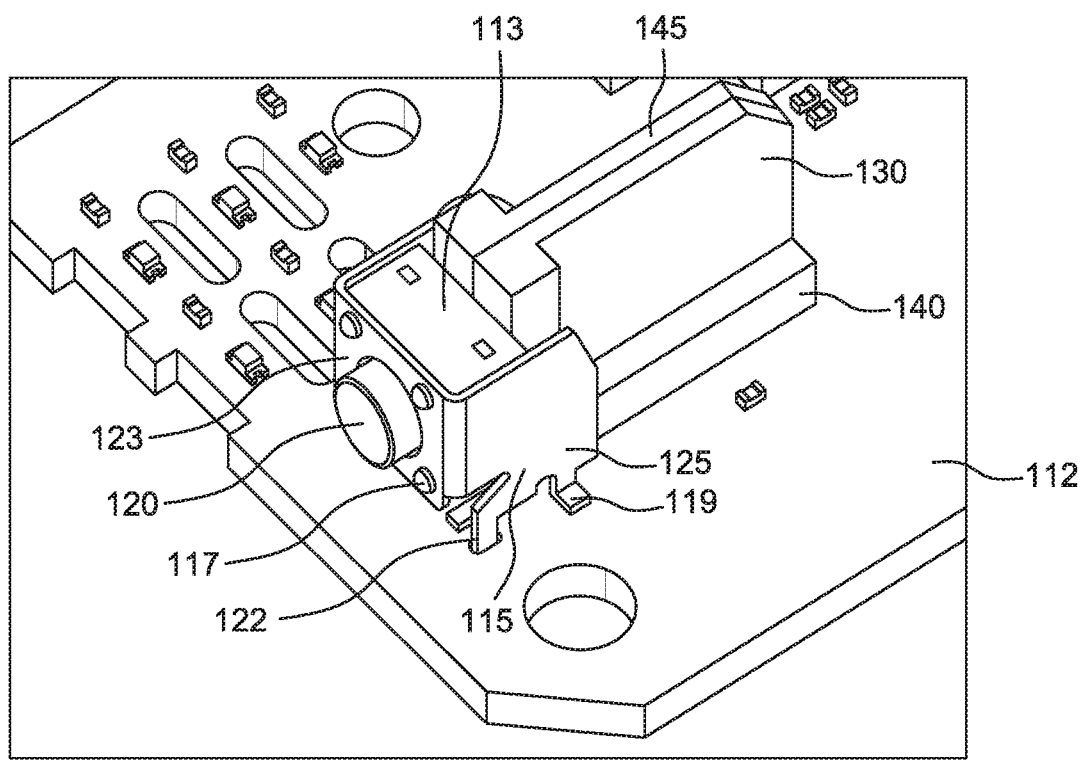
FIG. 3 shows a perspective view of the housing, pushbutton switch and a support member mounted on the surface of the printed circuit board of FIG. 1.

FIG. 3 is a perspective view of the housing 115 and pushbutton switch 113 mounted on the surface of the printed circuit board 112, and further showing a support member 130. The support member 130 is mounted on the surface of the printed circuit board 115 adjacent to a back surface 127 of the pushbutton switch 113.

The back surface 127 of the pushbutton switch 113 adjacent to the support member 130 contacts the support member 130, when the button 120 on the pushbutton switch member 113 is activated. The support member 130 impedes movement of the switch member 113 attached to the housing 115 in the direction of the activating force, i.e., front to back movement in the illustrated example. The front to back movement of the pushbutton switch 113 attached to the housing 115 can undesirably cause the adhesive (not shown) mounting the tabs 119 to the circuit board 112 to become stressed and eventually fail after the button 120 on the switch member 113 is repeatedly activated.

Additionally, the support member 130 in one exemplary embodiment is positioned between the extended portion of the sidewalls 125 beyond the back surface 127 (shown in FIG. 2) of the pushbutton switch 113. The support member 130 provides direct support for and minimizes front to back lateral movement of the pushbutton switch 113 and the housing 115 that it is attached to, when the button 120 on the pushbutton switch 113 is activated.

The support member 130 in one exemplary embodiment is preferably formed of a plastic material.

The exemplary support member 130 shown in FIG. 3 has a rectangular base 140 with a T-shaped portion 145 extending upward therefrom. The T-shaped portion 145 preferably extends above the housing 115. The T-shaped portion 145 of the support member 130 is positioned close to and/or may contact the back surface 127 of the pushbutton switch 113, when the button 120 is activated.

The T-shaped portion 145 of the support member 130 is contacted by the back surface 127 of the pushbutton switch 113 when the button 120 on the pushbutton switch 113 is activated because pushing the button 120 causes the pushbutton switch 113 to move in a front to back direction. The T-shaped portion 145 of the support member 130 minimizes the front to back lateral movement of the pushbutton switch 113 to be limited by the distance between the back surface 127 of the pushbutton switch 113 and the T-shaped portion 145 of the support member 130 when both are mounted on the surface of the PCB 112.

Figure 4:
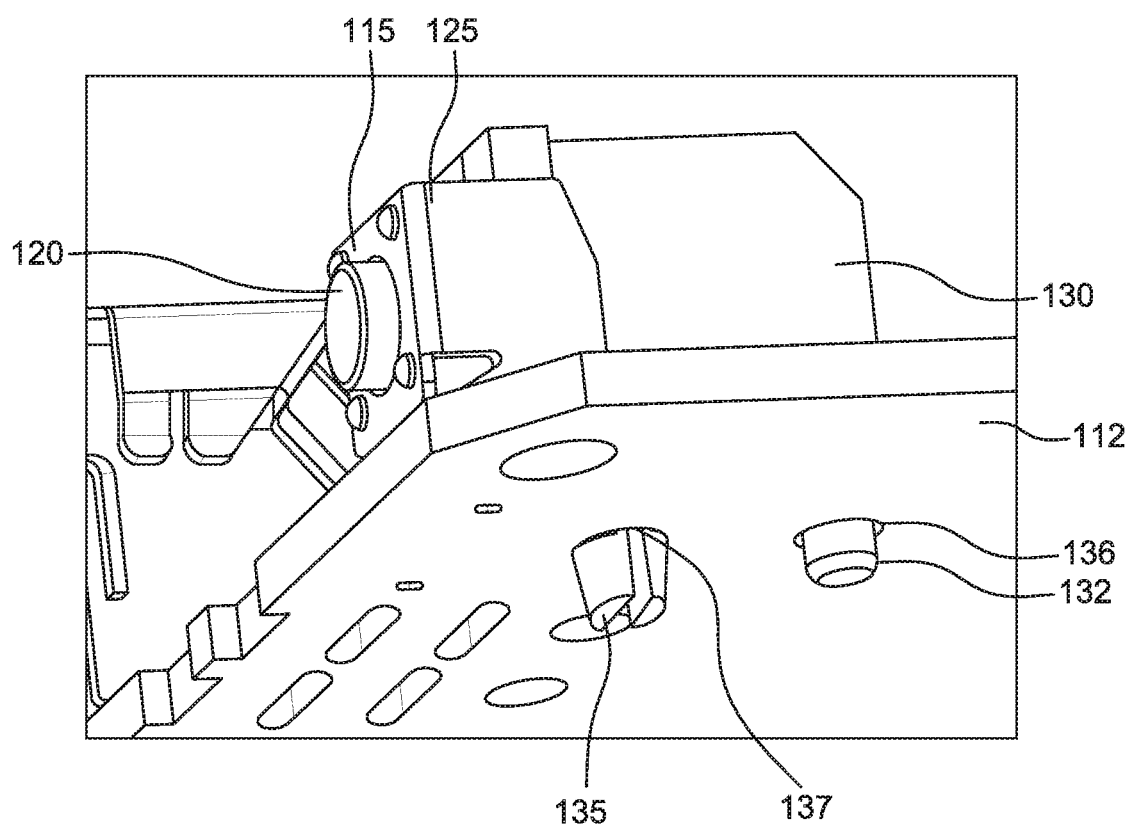
FIG. 4 shows a bottom perspective view of the housing and support member mounted on the printed circuit board of FIG. 3.

With reference to FIG. 4, there is shown a bottom perspective view of housing 115 and support member 130 mounted on the surface of the printed circuit board 112. The support member includes at least one retention barb 135 and a locating pin 132. The locating pin 132 and the retention barb 135 are attached to the bottom surface of the rectangular base 140 of the support member 130.

The locating pin 132 is inserted in a feedthrough 136 in the printed circuit board 112. Additionally, the retention barb 135 is inserted through feedthrough 137 (also shown in FIG. 2) of the printed circuit board 112. The retention barb 135 expands when pressed through the feedthrough 137 on the surface of the printed circuit board 112, attaching it thereto. The retention barb 135 along with the locating pin 132 minimize the lateral movement of the support member 130 in a front to back direction and/or a side to side movement when the button 120 on the pushbutton switch 113 is activated.

Figure 5:
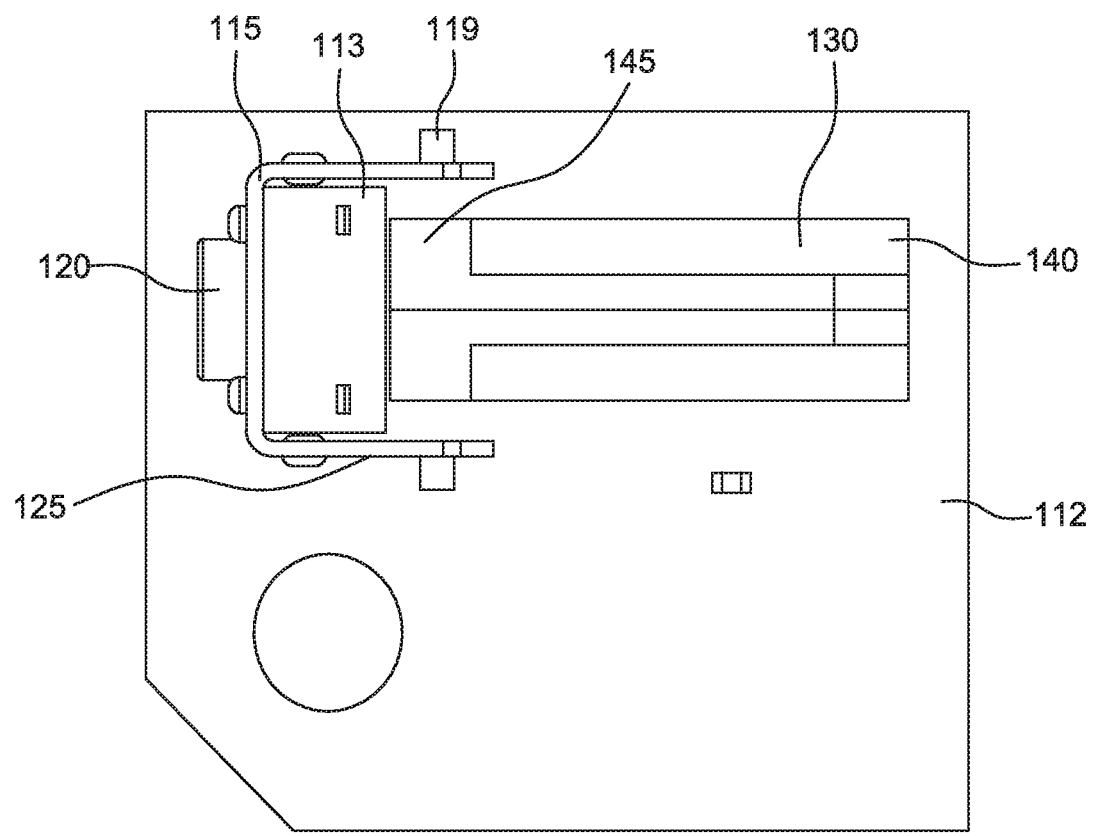
FIG. 5 shows a top view of the housing, pushbutton switch and support member mounted on the surface of the printed circuit board of FIG. 3.

FIG. 5 shows a top view of the housing 115, pushbutton switch 113 and support member 130 mounted on the surface of the printed circuit board 112 shown in FIG. 3. As previously shown in FIG. 3 the exemplary support member 130 has a rectangular base 140 and a T-shaped portion 145 extending upward therefrom.

Although embodiments have been described hereinabove with reference to specific examples, modifications will be apparent to a skilled person in the art which lie within the scope of the claims.

For instance, while in the foregoing examples the support member has been described as T-shaped, it will be appreciated that other form helping to limit movement of the switch can be envisaged.

Many further modifications and variations will suggest themselves to those versed in the art upon making reference to the foregoing illustrative embodiments, which are given by way of example only and which are not intended to limit the scope of the present disclosure, that being determined solely by the appended claims. In particular, the different features from different embodiments may be interchanged, where appropriate.

The invention claimed is:

1. A switch assembly, comprising:
   a switch member;
   a housing, wherein the switch member is attached to the housing; and
   a support member positioned adjacent to a back surface of the switch member, wherein the support member comprises a rectangular base and a T-shaped portion extending upward from the rectangular base and wherein the T-shaped portion of the support member is positioned between sidewalls of the housing adjacent to the back surface of the switch member.

2. The switch assembly of claim 1, wherein the back surface of the switch member adjacent to the support member contacts the support member when the switch member is activated.

3. The switch assembly of claim 1, wherein the switch member comprises a pushbutton switch moveable within the switch member for activation.

4. The switch assembly of claim 3, wherein the switch member is activated by application of a pressing force to the pushbutton at a first surface of the switch member and the back surface opposite the first surface contacts the support member when the switch member is activated.

5. The switch assembly of claim 4, wherein the support member acts to impede movement of the switch member in a direction of movement of the pressing force.

6. The switch assembly of claim 1, wherein the support member is formed of plastic.

7. The switch assembly of claim 1, wherein the housing has sidewalls that extend beyond the back surface of the switch member.

8. The switch assembly of claim 1, wherein the support member comprises at least one fastener to mount the support member on a surface of a printed circuit board.

9. The switch assembly of claim 8, wherein the at least one fastener limits movement of the support member in at least one of a direction of movement of the pushbutton switch and a generally perpendicular movement to the direction of movement of the pushbutton switch when the switch is activated.

10. The switch assembly of claim 1, wherein the T-shaped portion of the support member contacts the back surface of the switch member to limit the movement of the switch member in a direction of movement of the pushbutton switch to a distance between the surface of the switch member adjacent to the support member and the T-shaped portion of the support member.

11. An electronic device, comprising:
a printed circuit board;
a switch assembly comprising
a switch member,
a housing, wherein the housing is mounted on the printed circuit board and the switch member is attached to the housing; and
a support member mounted on a surface of the printed circuit board adjacent to a back surface of the switch member, wherein the support member comprises a rectangular base and a T-shaped portion extending upward from the rectangular base and wherein the T-shaped portion of the support member is positioned between sidewalls of the housing adjacent to the back surface of the switch member.

12. The electronic device of claim 11, wherein the back surface of the switch member adjacent to the support member contacts the support member when the switch member is activated.

13. The electronic device of claim 11, wherein the switch member comprises a pushbutton switch moveable within the switch member for activation.

14. The electronic device of claim 13, wherein the switch member is activated by application of a pressing force to the pushbutton at a first surface of the switch member and the back surface opposite the first surface contacts the support member when the switch member is activated.

15. The electronic device of claim, 14 wherein the support member acts to impede movement of the switch member in a direction of movement of the pressing force.

16. The electronic device of claim 11, wherein the support member is formed of plastic.

17. The electronic device of claim 11, wherein the housing has sidewalls that extend beyond the back surface of the switch member.

18. The electronic device of claim 17, wherein the sidewalls of the housing are provided with a plurality of support elements contacting the printed circuit board.

19. The electronic device of claim 11, wherein the support member comprises at least one fastener to mount the support member on the surface of the printed circuit board.

20. The electronic device of claim 19, wherein the at least one fastener limits movement of the support member in at least one of a direction of movement of the pushbutton switch and a generally perpendicular movement to the direction of movement of the pushbutton switch when the switch is activated.

21. The electronic device of claim 11, wherein the T-shaped portion of the support member contacts the back surface of the switch member to limit the movement of the switch member in a direction of movement of the pushbutton switch to a distance between the surface of the switch member adjacent to the support member and the T-shaped portion of the support member.

22. The electronic device of claim 11, wherein a plurality of fasteners are used to mount the housing on the surface of the printed circuit board.

23. A set top box, comprising:
a casing;
a printed circuit board, wherein a wall of the casing abuts a portion of a side of the printed circuit board; and
a switch assembly comprising
a switch member,
a housing, wherein the housing is mounted on the printed circuit board and the switch member is attached to the housing; and
a support member mounted on a surface of the printed circuit board adjacent to a back surface of the switch member, wherein the support member comprises a rectangular base and a T-shaped portion extending upward from the rectangular base and wherein the T-shaped portion of the support member is positioned between sidewalls of the housing adjacent to the back surface of the switch member.

* * * * *